United States Patent
Chen et al.

(10) Patent No.: US 10,404,264 B2
(45) Date of Patent: Sep. 3, 2019

(54) METHOD OF PERFORMING ANALOG-TO-DIGITAL CONVERSION

(71) Applicant: Analog Devices, Inc., Norwood, MA (US)

(72) Inventors: Baozhen Chen, Woburn, MA (US); Lalinda D. Fernando, Westford, MA (US); Zhichao Tan, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/040,140

(22) Filed: Jul. 19, 2018

(65) Prior Publication Data

US 2019/0081636 A1    Mar. 14, 2019

Related U.S. Application Data

(63) Continuation-in-part of application No. 15/700,957, filed on Sep. 11, 2017, now Pat. No. 9,923,569.

(60) Provisional application No. 62/648,225, filed on Mar. 26, 2018.

(51) Int. Cl.
*H03M 1/46* (2006.01)
*H03M 1/00* (2006.01)

(52) U.S. Cl.
CPC .......... *H03M 1/468* (2013.01); *H03M 1/002* (2013.01); *H03M 1/462* (2013.01)

(58) Field of Classification Search
None
See application file for complete search history.

(56) References Cited

U.S. PATENT DOCUMENTS

| | | | |
|---|---|---|---|
| 5,122,800 A | 6/1992 | Philipp | |
| 5,543,795 A | 8/1996 | Fernald | |
| 5,736,953 A | 4/1998 | Yamaguchi | |
| 7,038,609 B1 | 5/2006 | Hurrell | |
| 7,215,274 B2 | 5/2007 | Liu | |
| 7,405,689 B2 | 7/2008 | Kernahan et al. | |
| 7,986,253 B2 | 7/2011 | Cho et al. | |

(Continued)

FOREIGN PATENT DOCUMENTS

| | | |
|---|---|---|
| CN | 102427368 | 4/2012 |
| WO | 2017212075 | 1/2018 |

(Continued)

OTHER PUBLICATIONS

"International Application Serial No. PCT US2018 050268, International Search Report dated Dec. 6, 2018", 4 pgs.

(Continued)

*Primary Examiner* — Howard Williams
(74) *Attorney, Agent, or Firm* — Schwegman Lundberg & Woessner, P.A.

(57) ABSTRACT

A method of performing analog-to-digital conversion using a successive approximation (SAR) analog-to-digital converter (ADC). A previous digital output is compared to a range based on the first M bits of the previous digital output. If the previous digital output is within that range, a digital-to-analog converter (DAC) of the SAR ADC is preloaded with the first M bits of the previous digital output, prior to commencing bit trials. If the previous digital output is outside of that range, an offset is applied to the first M bits of the previous digital output and the DAC is preloaded based on the M bits and the offset, prior to performing bit trials. This method reduces the possibility of the next input being outside of a further range defined by the preload.

23 Claims, 8 Drawing Sheets

(56) References Cited

U.S. PATENT DOCUMENTS

| | | | |
|---|---|---|---|
| 8,004,448 | B2 | 8/2011 | Carreau |
| 8,169,517 | B2 | 5/2012 | Poonnen et al. |
| 8,416,116 | B2 | 4/2013 | Chang et al. |
| 8,421,658 | B1 | 4/2013 | Yau et al. |
| 8,502,723 | B2 | 8/2013 | Chen et al. |
| 8,674,862 | B1 | 3/2014 | Li et al. |
| 8,766,839 | B2 | 7/2014 | Janakiraman et al. |
| 8,787,204 | B2 | 7/2014 | Ludwig |
| 8,902,093 | B1 | 12/2014 | Leuciuc et al. |
| 8,933,385 | B2 | 1/2015 | Wang et al. |
| 8,963,761 | B2 | 2/2015 | Tsai et al. |
| 8,981,973 | B2 | 3/2015 | Kumar |
| 9,148,166 | B2 | 9/2015 | Narayan et al. |
| 9,467,638 | B2 | 10/2016 | Chen et al. |
| 9,641,189 | B2 | 5/2017 | Maddox et al. |
| 9,712,181 | B1 | 7/2017 | Chen et al. |
| 9,912,346 | B1* | 3/2018 | Hamilton ............ H03M 1/1245 |
| 9,923,569 | B1 | 3/2018 | Chen et al. |
| 2005/0122247 | A1* | 6/2005 | Hammerschmidt .. H03M 1/002 341/163 |
| 2005/0151680 | A1 | 7/2005 | Kearney |
| 2006/0158365 | A1* | 7/2006 | Kernahan ............... H03M 1/38 341/155 |
| 2008/0043128 | A1 | 2/2008 | Poonnen et al. |
| 2010/0085225 | A1 | 4/2010 | Chang et al. |
| 2012/0274488 | A1 | 11/2012 | Kapusta |
| 2012/0274489 | A1 | 11/2012 | Chang et al. |
| 2013/0194121 | A1* | 8/2013 | Piasecki ................ H03M 1/468 341/172 |
| 2014/0035771 | A1 | 2/2014 | Tsai et al. |
| 2014/0043175 | A1 | 2/2014 | Fogleman et al. |
| 2015/0073228 | A1* | 3/2015 | Shen ....................... H03M 1/12 341/155 |

FOREIGN PATENT DOCUMENTS

| | | |
|---|---|---|
| WO | 2019051410 | 3/2019 |
| WO | 2019051414 | 3/2019 |

OTHER PUBLICATIONS

"International Application Serial No. PCT US2018 050268, Written Opinion dated Dec. 6, 2018", 10 pgs.

Chiang, Ken Chia-Han, "A signal-specific approach for reducing SAR-ADC power consumption", IEEE Biomedical Circuits and Systems Conference (BIOCAS), (2013), 278-281.

Hassan, Sepehrian, "A signal-specific successive-approximation analog-to-digital converter", IEEE Intl. Symposium on Circuits and Systems (ISCAS), (May 15, 2011), 1624-1627.

Wen-Sin, Liew, "A moving binary search SAR-ADC for low power biomedical data acquisition system", IEEE Asia Pacific Conference on Circuits and Systems (APCCAS), (Nov. 30, 2008), 646-649.

Chen, Baozhen, "An Adaptive SAR ADC for DC to Nyquist Rate Signals", IEEE International Symposium on Circuits (ISCAS), (May 2018), 5 pgs.

Pelgrom, Marcel J.M., "Analog-to-Digital Conversion Ch. 8, Sec. 5", Springer, pp. 305-312, (2010), 470 pgs.

Yip, Marcus, "A Resolution—Reconfigurable 5-to-10-Bit 0.4-to-1 V Power Scalable SAR ADC for Sensor Applications", IEEE Intl. Solid-State Circuits Conference, (Feb. 20-24, 2011), 26 pgs.

"International Application Serial No. PCT US2018 050260, International Search Report dated Jan. 11, 2019", 6 pgs.

"International Application Serial No. PCT US2018 050260, Written Opinion dated Jan. 11, 2019", 13 pgs.

Hang, Yu, "A Two-Step Prediction ADC Architecture for Integrated Low Power Image Sensors", IEEE Transactions on Circuits and Systems I: Regular Papers, vol. 64, No. 1, (Jan. 1, 2017), 50-60.

"U.S. Appl. No. 15/700,957, Notice of Allowance dated Dec. 12, 2017".

"U.S. Appl. No. 15/700,957, Preliminary Amendment filed Oct. 17, 2017", 8 pgs.

Maxim Innovation Delivered, "High-Efficiency, Low-Noise Audio Subsystem", MAX97003, (Sep. 1, 2011), 48 pgs.

Tai, Hung-Yen, et al., "Data Converter Techniques", 2014 IEEE International Solid-State Circuits Conference, (Feb. 11, 2014), 3 pgs.

Van Rethy, Jelle, et al., "Predictive sensing in analog-to-digital converters for biomedical applications", IEEE, (2013), 4 pgs.

Waters, Allen, et al., "A ADC Using an LSB First SAR Quantizer", 2015 IEEE, (Sep. 2015), 4 pgs.

Wood, Nicholas, "Predicting ADC: A New Approach for Low Power ADC Design", 2014 IEEE, (Feb. 2014), 4 pgs.

Yaul, Frank, et al., "A 10 bit SAR ADC With Data-Dependent Energy Reduction Using LSB First Successive Approximation", IEEE Journal of Solid-State Circuits, vol. 49, No. 12, (Dec. 2014), 10 pgs.

* cited by examiner

METHOD OF PERFORMING ANALOG-TO-DIGITAL CONVERSION

CLAIM OF PRIORITY

This patent application claims the benefit of priority to U.S. Provisional Patent Application No. 62/648,225, filed Mar. 26, 2018, and U.S. application Ser. No. 15/700,957, filed Sep. 11, 2017, which applications and publications are incorporated herein by reference in their entirety.

FIELD

The present disclosure relates to a method of performing analog-to-digital conversion.

BACKGROUND

Analog-to-digital converters (ADCs) convert analog input signals into digital codes. One type of ADC is a successive approximation register (SAR) ADC. A SAR ADC essentially guesses a digital output code by successively comparing different digital codes with the input signal. To do this, a digital-to-analog converter (DAC) is used. The DAC is set to a particular value, and the analog output of the DAC is compared to the analog input signal. For example, in a 4-bit DAC, the DAC may be set to 1,0,0,0, which generates an analog signal at the midpoint of the range of the DAC. If the analog input signal is higher than this, the SAR keeps the '1', and moves to the next bit. If the analog input signal is lower than this, is sets this bit to '0'. Assuming the analog input was higher than the digital signal, the SAR sets the DAC to 1,1,0,0, and performs the same comparison. Each of these comparisons is called a bit trial, and the process continues until the SAR settles on a digital code which is an approximation of the analog input.

When the input signal is slow moving, it is likely that the most significant bit (MSB) will not change between conversions. As such, to speed up the process, and to reduce power, the MSB can be preloaded. As such, rather than perform bit trials for all of the bits, bit trials are only performed for the latter bits. However, when the input signal moves towards the bit boundary, it becomes increasingly likely than the next digital output signal will not share the MSB. As such, if the MSB is preloaded based on the previous digital output, errors can occur.

SUMMARY OF THE DISCLOSURE

A method of performing analog-to-digital conversion using a successive approximation (SAR) analog-to-digital converter (ADC). A previous digital output is compared to a range based on the first M bits of the previous digital output. If the previous digital output is within that range, a digital-to-analog converter (DAC) of the SAR ADC is preloaded with the first M bits of the previous digital output, prior to commencing bit trials. If the previous digital output is outside of that range, an offset is applied to the first M bits of the previous digital output and the DAC is preloaded based on the M bits and the offset, prior to performing bit trials. This method reduces the possibility of the next input being outside of a further range defined by the preload.

In a first aspect, the present disclosure provides a method of performing analog-to-digital conversion using a successive approximation register (SAR) analog-to-digital converter (ADC), comprising: performing bit trials, using a digital-to-analog converter (DAC) circuit of the SAR ADC, to convert a first sample of an analog input signal into an N-bit digital output; before performing bit trials on a second sample of the analog input signal, comparing the N-bit digital output with a first range, the first range based on the N-bit digital output; if the N-bit digital output is within the first range, preloading M bits of the N-bit digital output from the first sample onto the DAC circuit; if the N-bit digital output is outside the first range, preloading M bits of the N-bit digital output from the first sample plus an offset onto the DAC circuit; performing bit trials on a second sample to determine the bits remaining.

In a second aspect, the present disclosure provides a successive approximation register (SAR) analog-to-digital converter (ADC) configured to perform bit trials to convert a first sample of an analog input signal into an N-bit digital output, the SAR ADC comprising: a digital-to-analog converter (DAC) circuit; and a control circuit configured to: compare the N-bit digital output with a first range, the first range based on the N-bit digital output, before performing bit trials on a second sample of the analog input signal; instruct the DAC to preload M bits of the N-bit digital output from the first sample onto the DAC circuit if the N-bit digital output is within the first range; instruct the DAC to preload M bits of the N-bit digital output from the first sample plus an offset onto the DAC circuit if the N-bit digital output is outside the first range; and instruct the DAC to perform bit trials on a second sample to determine the bits remaining.

In a third aspect, the present disclosure provides a method of preloading a digital-to-analog converter (DAC) arranged to perform bit trials in an analog-to-digital converter (ADC), comprising: determining a subrange defined by the first M bits of the previous N-bit digital output of the ADC, the subrange having a central portion and edge portions; determining the position of the previous digital output within the subrange; if the previous digital output is within the central portion of the subrange, preloading the M bits onto the DAC; if the previous digital output is within the edge portions, preloading the M bits plus an offset onto the DAC.

Further aspects of the disclosure are described in the description and defined in the appended claims.

BRIEF DESCRIPTION OF THE DRAWINGS

The disclosure will now be described by way of example only and with reference to the accompanying drawings, in which.

DETAILED DESCRIPTION

The present disclosure provides a method of analog-to-digital conversion in which the preloaded bits may be modified to take account of the previous digital output being close to the bit boundary. It does this by determining how close the previous digital output is to the bit boundary. If it is sufficiently far from the boundary, then the preload is not modified, and the first bit or bits are preloaded so that they are the same as the first bit or bits of the previous digital output. If the previous digital output is close to the boundary, an offset is added to the first bit or bits in order to centre the previous digital output in the middle of the range defined by the preload.

For example, if the previous digital output is close to the top boundary, half a bit is added to the preload. If the previous digital output is close to the bottom of the boundary, half a bit is subtracted from the preload. The half bit may be achieved by using split-capacitors in the DAC, so that each bit may be set to half its value.

Figure 1:
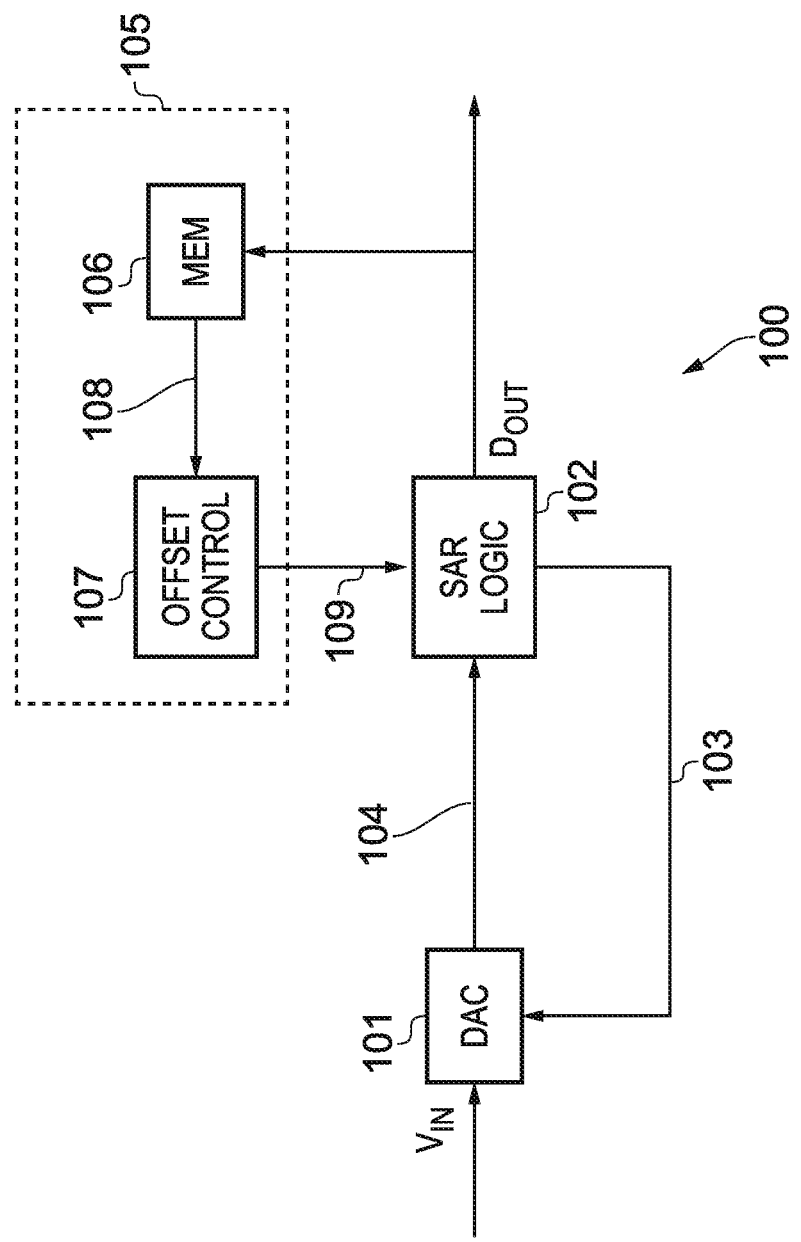
FIG. 1 is schematic circuit diagram of a SAR ADC in accordance with an embodiment of the disclosure.

FIG. 1 is a schematic circuit diagram of a successive approximation register (SAR) analog-to-digital converter (ADC) 100 in accordance with an embodiment of this disclosure. The SAR ADC 100 includes a digital-to-analog converter (DAC) 101 and SAR logic 102. The DAC 101 is a binary-weighted capacitive DAC. As such, the DAC 101 performs sample and hold operations on the analog input signal $V_{IN}$. Furthermore, the DAC 101 includes a comparator to compare samples of the analog input signal $V_{IN}$ to an analog signal generated by the DAC during bit trials. As well as receiving $V_{IN}$ as an input to the DAC 101, the DAC receives a control signal 103 from SAR logic 102. The control signal 103 is used to control switches within the DAC 101 to generate different voltage levels based on a digital code generated by the SAR logic 102. The comparator of the DAC 101 generates an output 104 which is used by the SAR logic to determine a digital output signal Dour that is an approximation of the analog input signal $V_{IN}$. Further details of the structure and operation of the DAC 101 are provided below.

The SAR ADC operates by performing bit trials, using the DAC 101, to determine a digital output signal $D_{OUT}$ that is an approximation of the analog input signal $V_{IN}$. The DAC 101 includes a number of binary-weighted capacitors, with each capacitor representing one bit (although some bits may include two capacitors, as will be described in more detail below). The SAR logic 102 controls each capacitor using a plurality of switches, to generate a voltage equivalent to the bit represented by the capacitor. These voltages are compared by the comparator to the analog input signal $V_{IN}$ to determine if that bit should be set to a '1' or a '0'. The SAR logic 102 does this by starting with the most significant bit (MSB) and moving through the capacitors to the least significant bit (LSB). This process proceeds until all of the bit trials are complete, and the SAR logic 102 has determined the digital output signal $D_{OUT}$.

The SAR ADC 100 is also able to preload some bits of the DAC 101 in order to reduce the power consumption of the SAR ADC 100. For example, based on the N-bit digital output signal $D_{OUT}$ of the previous sample of the analog input signal $V_{IN}$, the DAC may preload the first M bits prior to performing bit trials on the remaining bits. In this example, the first bit is the MSB, and the last bit is the LSB. As such, the Mth bit is the MSB plus M bit. All bits from the MSB to the Mth bit are preloaded. When the input signal is slow-moving, it is likely that the next digital output will share a certain number of bits with the previous digital output signal. Assuming the first M bits are common between the previous and next digital outputs, there is no need to perform bit trials on the first M bits. As such, preloading these bits saves power.

In order to determine the value of the preloaded bits, the SAR ADC 100 includes a preload control circuit 105. The preload control circuit 105 includes memory 106 and offset control 107. The memory 106 receives the N-bit digital output $D_{OUT}$ from SAR logic 102 of the previous conversion. The memory 106 provides offset control 107 with the previous N-bit digital output signal via connection 108. The offset control 107 determines how many bits to preload, and what the value of those bits should be. Once this determination is made, the offset control 107 instructs the SAR logic 102, via connection 109, to preload the necessary bits into DAC 101. In this example, the number of preloaded bits is fixed for each conversion.

Figure 2:
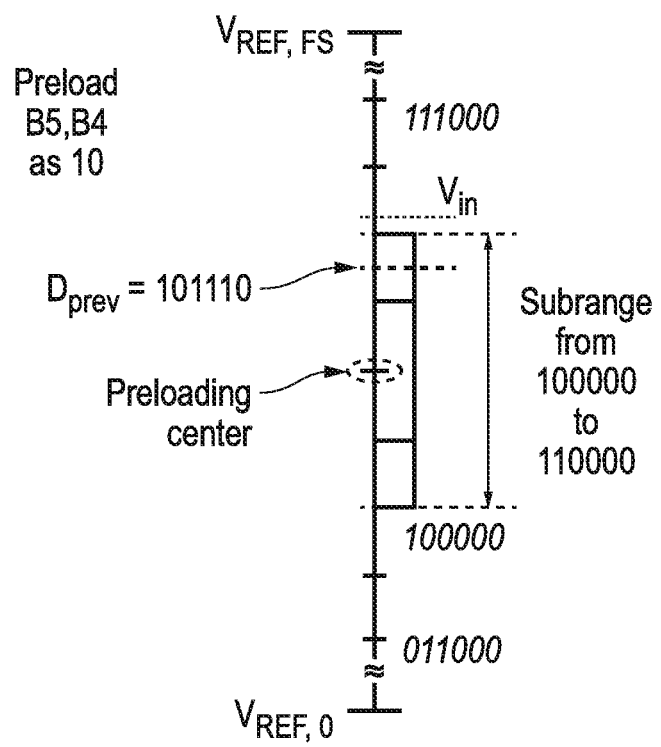
FIG. 2 shows a range defined by preloading M bits.

As will be described in more detail below, once the M bits are preloaded, the next sample of the analog input signal $V_{IN}$ must have a digital value in which the first M bits are the same as the preloaded bits. If it doesn't, the circuit will produce an erroneous signal, or it will have to clear the preloaded bits, and undertake bit trials for all bits. While it is likely that the next digital output will share M bits with the preload, there may be instances in which it will not. An example is shown in FIG. 2. The preloaded bits essentially define a range within which the next signal must fall. In this example, a 6-bit DAC is used. The previous signal was 101110 (46) and M=2. As such, the preloaded bits will be 1,0. The range possible for the next digital output is then 100000 (32) to 110000 (48). In this case, the previous digital output of 101110 (46) is very close to the edge of the range. As such, the next sample of the analog input signal could quite easily be outside this range. In this example, the digital equivalent of the next signal is 110001 (49). In this situation, the SAR ADC 100 must either discard the preloaded bits and perform bit trials on the all bits, or it will produce an erroneous output. In essence, any given binary number may fall anywhere with a range defined by the first M bits. This means that using the first M bits of the previous digital output as the basis for a range, within which the next output must fall, is prone to error when the previous digital output is towards the edge of that range.

The offset control 107 determines where the previous digital output falls within the range defined the first M bits of that output. If the previous output falls within a middle portion of that range, the offset control 107 instructs the SAR logic 102 to preload the first M-bits of the previous digital output into the DAC 101. However, if the previous digital signal is towards an end of that range, the offset control 107 adds an offset to the preload in order to shift the range up or down. By doing this, the range can be shifted such that the previous digital output is towards the middle of the range. This increases the likelihood that the next sample will be towards the middle portion of the range, and reduces the chance of errors. For example, the offset control 107 may determine whether the previous digital signal is within the middle quarters of the range, or the outer quarters of the range. This is shown in FIG. 3.

Figure 3:
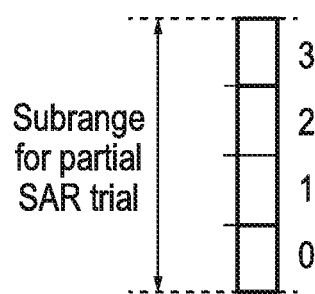
FIG. 3 shows the manner in which the range can be divided into quarters.
Figure 4:
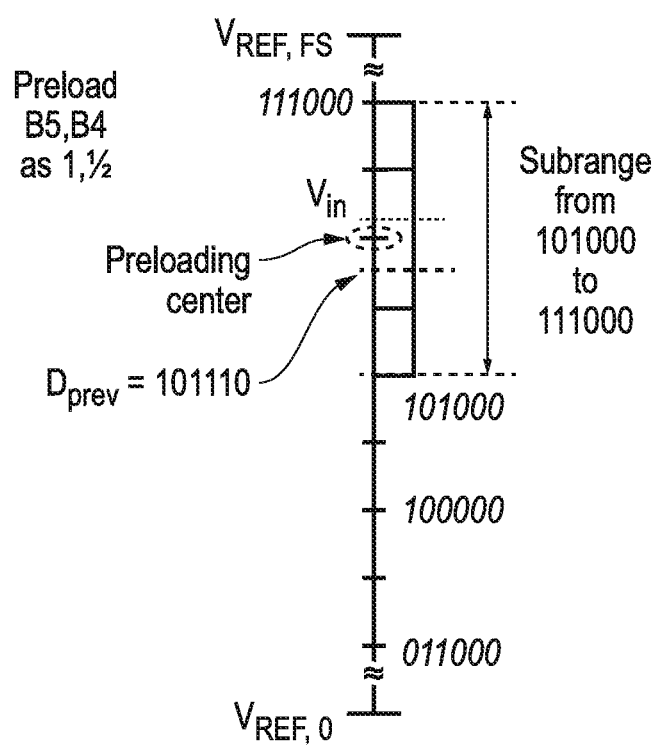
FIG. 4 shows how an offset can be added to the preload, in accordance with an embodiment of the disclosure.

FIG. 4 shows an example of the offset applied by offset control 107, based on the previous digital output shown in FIG. 3. In this example, to determine whether or not the previous digital output is within the middle quarters, the offset control 107 must determine the upper and lower bounds of the subrange defined by the middle quarters. The offset control 107 determines the lower bound of the subrange by adding a quarter of the Mth bit to the M bits, and the upper bound adding three quarters of the Mth bit to the M bits. For a 6-bit digital signal where M is 2, the Mth bit is equivalent to 16. As such, four (000100) is added to the M bits to obtain the lower bound, and twelve (001100) is added to the M bits to obtain the upper bound. In the example given above, the M bits are 1,0 and as such the lower bound is 100100 and the upper bound is 101100. The previous digital output is 101110, which is in the upper quarter, outside of this range. As such, the offset control 107 adds an offset to the preload. In this example, the offset is halve the Mth bit; i.e. 0, As such, the preload becomes 1,½, and the range then becomes 101000 (40) to 111000 (56), as shown in FIG. 4. As such, the previous digital output is now towards the middle of the range, and in the example given above the next analog input signal is also within the range.

The half bit is provided by using a split-capacitor arrangement. Some of the bits of the DAC 101 are represented by two capacitors, with each capacitor having half the value of a single equivalent capacitor. For example, in a 6-bit DAC, the second bit, representing 16, may include two capacitors that are equivalent to the third bit, representing 8. As such, by using both capacitors, the DAC output is equivalent to 16, whereas if one is used, the output is equivalent to 8. This arrangement will be described in more detail with reference to FIG. 5.

Figure 5:
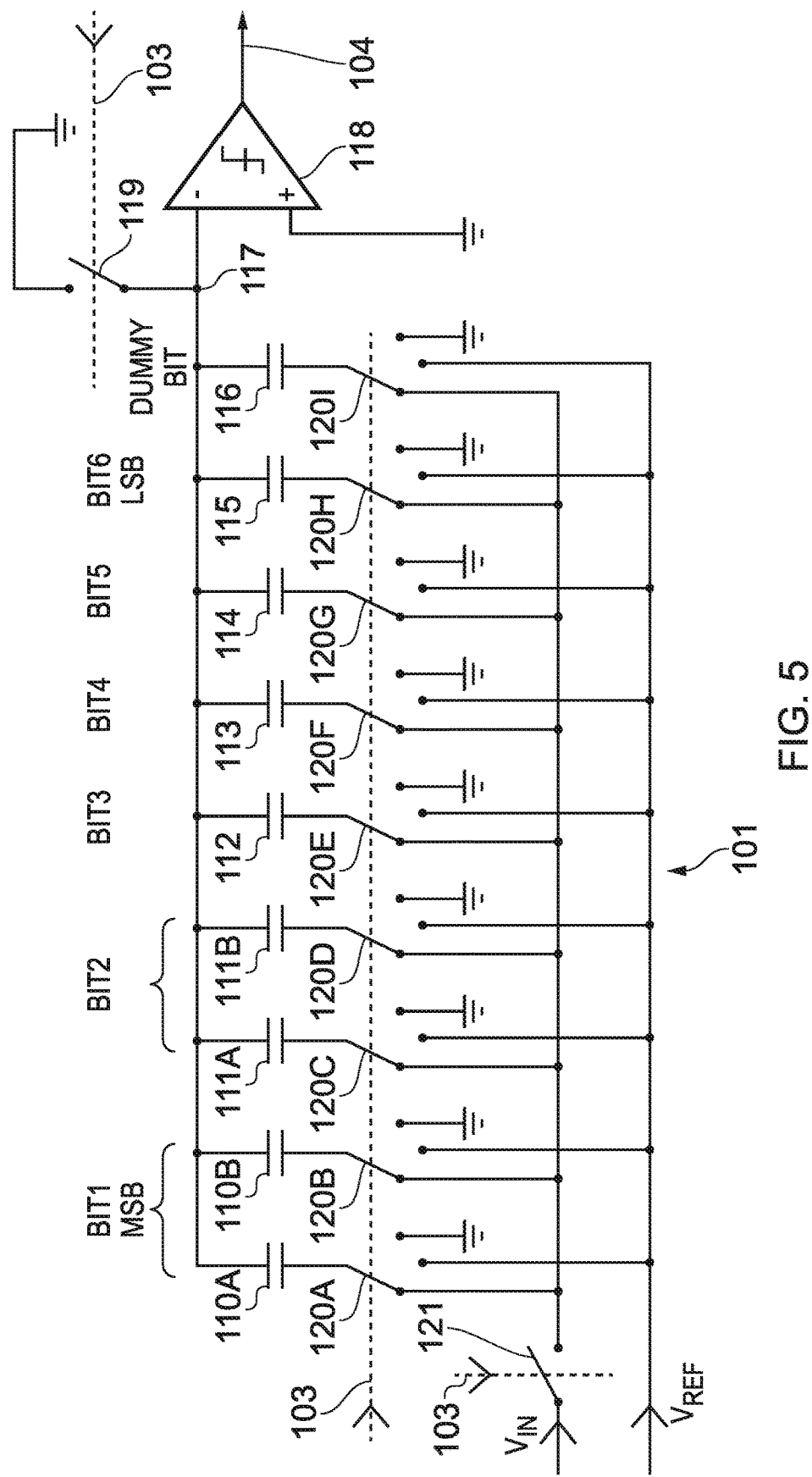
FIG. 5 is schematic circuit diagram of a binary-weighted capacitive DAC in accordance with an embodiment of the disclosure.

FIG. 5 is a schematic diagram showing the internal components of the DAC 101. As noted above, the DAC 101 is a binary-weighted capacitive DAC. As such, it includes a number of capacitors representing the different bits of the digital input code. In the example shown in FIG. 5, the DAC is a 6-bit DAC. Each bit of the DAC includes a binary-weighted capacitor, or pair of split-capacitors, each able to hold a charge equivalent to the respective bit. Bit 1 is the most significant bit (MSB) and represents binary equivalent of thirty two. In this example, bit 1 is represented by a pair of split capacitors 110A and 110E each having a value equivalent to sixteen. Bit 2 represents the binary equivalent of 16 and includes a pair of split capacitors 111A and 111B. Each of these capacitors has a value equivalent to eight. Bit 3 represents the digital equivalent of 8 and has a single capacitor 112. Bit 4 has a single capacitor 113 representing digital 4. Bit 5 has one capacitor 114 representing digital 2. Bit 6 is the least significant bit (LSB) having a single capacitor 115 representing digital 1. Bit 7 is a dummy bit which is equivalent in value to 115.

The capacitance of bit 1 is C, and as such the capacitance of each capacitor 110A and 110B is C/2. The capacitance of the remaining bits is as follows:
Bit 2=C/2
Bit 3=C/4
Bit 4=C/8
Bit 5=C/16
Bit 6=C/32
Bit 7=C/32

As such, the value of the remaining capacitors is as follows:
111A=C/4
111B=C/4
112=C/4
113=C/8
114=C/16
115=C/32
116=C/32

The total capacitance, $C_{TOTAL}$, for the array is 2C. The dummy bit (bit 7) is there to ensure the total is 2C. The upper plates of each of the capacitors are connected to a common node 117, which is connected to the negative input of the comparator 118. The common node 117 is also connected to ground via switch 119. The bottom plate of each of the capacitors is connected to a respective switches 120A to 120I. Each switch is a three-way switch which may be connected to the analog input signal $V_{IN}$, a reference voltage $V_{REF}$ and ground. The analog input signal $V_{IN}$ is connected to the switches via a further switch 121. The switches are controlled by the control signal 103 from the SAR logic 102.

Figure 6:
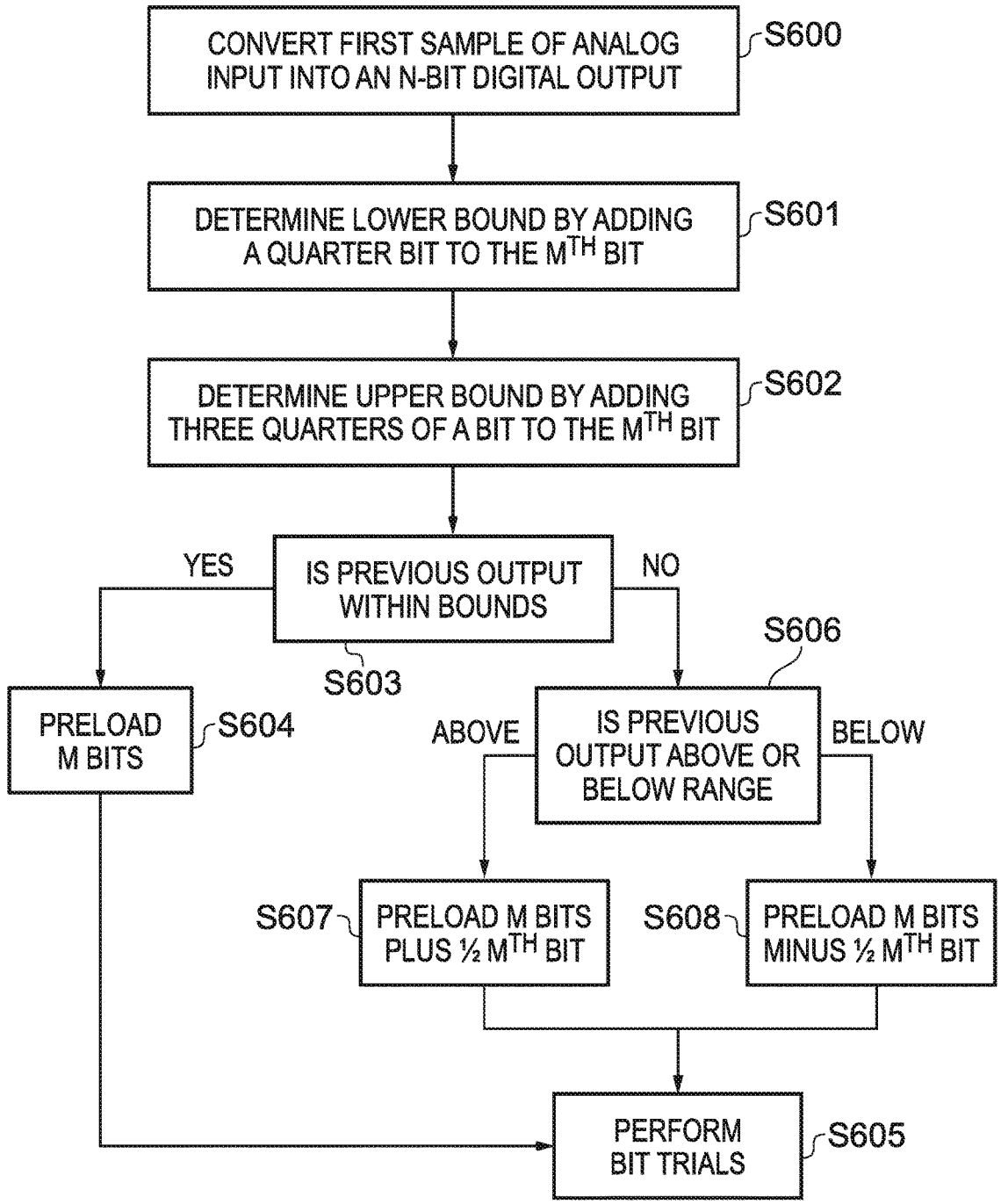
FIG. 6 is a flow chart showing the operation of the SAR ADC of FIG. 1.
Figure 7:
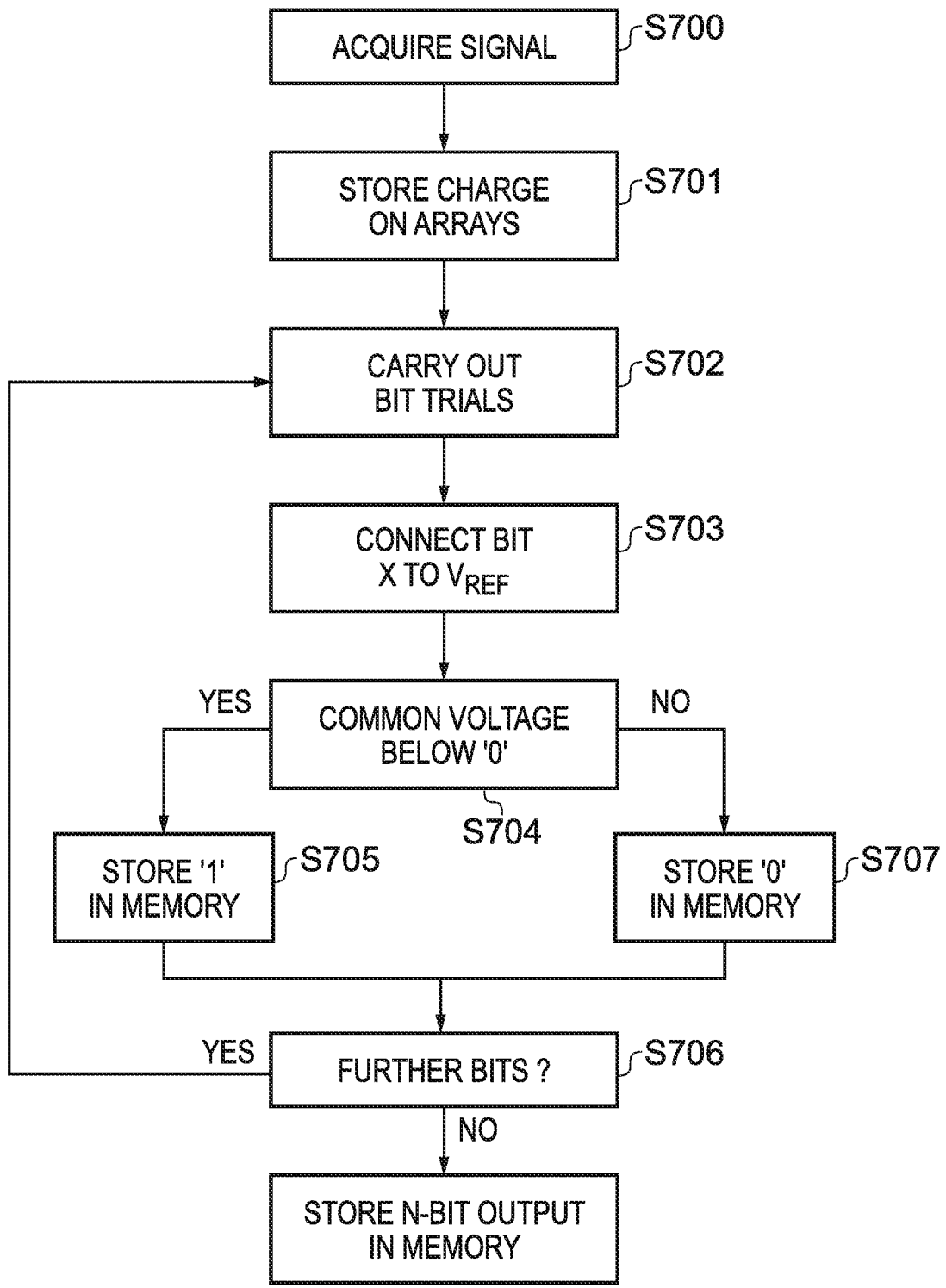
FIG. 7 is a flow chart showing a further operation of the SAR ADC of FIG. 1.

The operation of the SAR ADC 100 will now be described with reference to FIG. 6. In this example, M=2 and as such, the SAR ADC 100 is configured to preload bits 1 and 2. A first sample of the analog input signal $V_{IN}$ is converted to a digital output signal without preloading the capacitors of the DAC 101 (S600). The process of determining a digital output signal based on the first sample of the analog input signal is shown in FIG. 7. To acquire the input signal, the switch 119 is closed to connect the common terminal 117 to ground. The switch 121 is closed and each of the switches 120A to 120I are connected to the analog input signal $V_{IN}$ (S700). After acquisition, switches 121 and 119 are opened, and a charge equivalent to $V_{IN}$ is stored across the array of capacitors (S701).

The switches 120A to 120I are then connected to ground causing the common terminal 117 to drop to $-V_{IN}$. The bit trials then begin with the most significant bit (MSB) (S702). To do this, capacitors 110A and 110B are connected to $V_{REF}$ thereby adding a voltage equivalent to ½×$V_{REF}$ (S703). The common voltage at node 117 is therefore $-V_{IN}$+½×$V_{REF}$. The comparator 118 then compares the voltage on the common node to zero (S704). The comparator 118 produces a logic 1 if the common voltage is below 0 (i.e. if $V_{IN}$ is greater than ½×$V_{REF}$) The comparator 118 produces a logic 0 if the common voltage is greater than 0 (i.e. if $V_{IN}$ is less than ½ of $V_{REF}$). If the comparator produces a logic 1, the SAR logic 102 keeps capacitors 110A and 110B connected to $V_{REF}$ and stores the logic 1 in memory (S705). The SAR logic determines if there are any further bits (S706). If yes, the bit trials then move onto the next bit, and the process continues. In this case, capacitors 111A and 111B are then connected to $V_{REF}$ adding a voltage equivalent to $V_{REF}$/4 to the voltage on the common node 117. Again, if the common voltage is less than 0 then the comparator produces a logic 1, and if the voltage at the common node 117 is greater than 0 then it produces a logic 0. In the event of a logic 0, the SAR logic stores this in memory and connects the capacitors 111A and 111B to ground, thereby removing the $V_{REF}$/4 voltage from the node 117 (S707). This continues until all of the bit trials have been completed. An N-bit digital word is then stored in memory 106 representative of the first sample of the analog input signal $V_{IN}$ (S708).

The offset control 107 then determines the value of the bits to preload into the DAC 101 for the second conversion. In this example, the SAR ADC 100 is arranged to preload the first two bits of the DAC. As noted above, the first two bits of the DAC include split capacitors. The value of the first two bits defines a range within which the subsequent bit trials will be performed. For example, if the value of the first two bits are 1,0 and if these bits were preloaded, the range would be 1,0,0,0,0,0 and 1,1,0,0,0,0. This range may be further divided into four quarters. The aim of the offset control 107 is to determine if the previous digital output is within the middle two quarters, or within the outer quarters. As such, the offset control 107 determines a subrange equivalent to the inner two quarters. It does this by adding a quarter of the 2nd (Mth) bit to the first two bits to determine the lower bound (S601). Using the example shown in FIGS. 2 and 4, the lower bound would be 1,0,0, 0,0,0 (32) plus 0,0,0,1,0,0 (4) which equals 1,0,0,1,0,0 (36). The offset control 107 then adds three quarters to the first two bits to determine the upper bound (S602). In this example, the upper bound would be 1,0,0,0,0,0 (32) plus 0,0,1,1,0,0 (12) which equals 1,0,1,1,0,0 (44).

The offset control 107 then determines if the previous digital output stored in memory 106 is within the subrange (S603). If it is within the subrange, the offset control 107 instructs the SAR logic 102 to preload the first two bits to be the same as the previous digital output (S604). It does this after the second sample of the analog input signal has been loaded onto node 117, by connecting each of the capacitors 110A, 110B, 111A, 111B to either $V_{REF}$ or ground, depending on the previous digital output. In the example given above, the preloaded bits would be 1,0 and as such, capacitors 110A and 110B would be connected to $V_{REF}$ and capacitors 111A and 111E would be connected to ground. The bit trials then proceed with bit 3 in the manner described above (S605).

In this example, the previous digital output 1,0,1,1,1,0 is outside the subrange. As such, the offset control 107 next determines if the previous digital value is in the upper or lower quarters (S606). In this example, it is in the upper quarter, and as such the SAR logic 102 adds an offset to the first M bits (S607). In this example, the SAR logic 102 adds a half bit to bit 2 (the Mth bit). As such, the preload will be 1,½. This causes the range within which further bit trials will be undertaken to move up by half of the Mth bit, thereby centring the previous digital output in the middle of the range. This decreases the possibility of the next input being outside of the range. In this example, capacitors 110A and 110B are preloaded by connecting them to $V_{REF}$, so that bit 1 is set to '1'; the digital equivalent of 32. Capacitor 111A is preloaded by connecting it to $V_{REF}$, whereas 111B is not preloaded by connecting it to ground, thereby setting bit 2 to '½'; the digital equivalent of 8. The bit trials then proceed with bit 3 in the manner described above (S605). If the previous digital output had been in the lower quarter, the offset control 107 would instruct the SAR logic 107 to subtract half a bit (S608). As such, the preload will be ½,½. In this alternative, capacitors 110A and 111A are preloaded by connecting them to $V_{REF}$, so that bit 1 is set to '½'; the digital equivalent of 16. Capacitors 110E and 111B are not preloaded by connecting them to ground, thereby setting bit 2 to '½'; the digital equivalent of 8. As such, the total preload is 24. The bit trials then proceed with bit 3 in the manner described above (S605).

In the above examples, the DAC is a 6-bit DAC and the number of preloaded bits is 2. It will be appreciated that the disclosure can be applied to DACs having different numbers of bits and with different values of M.

Figure 8:
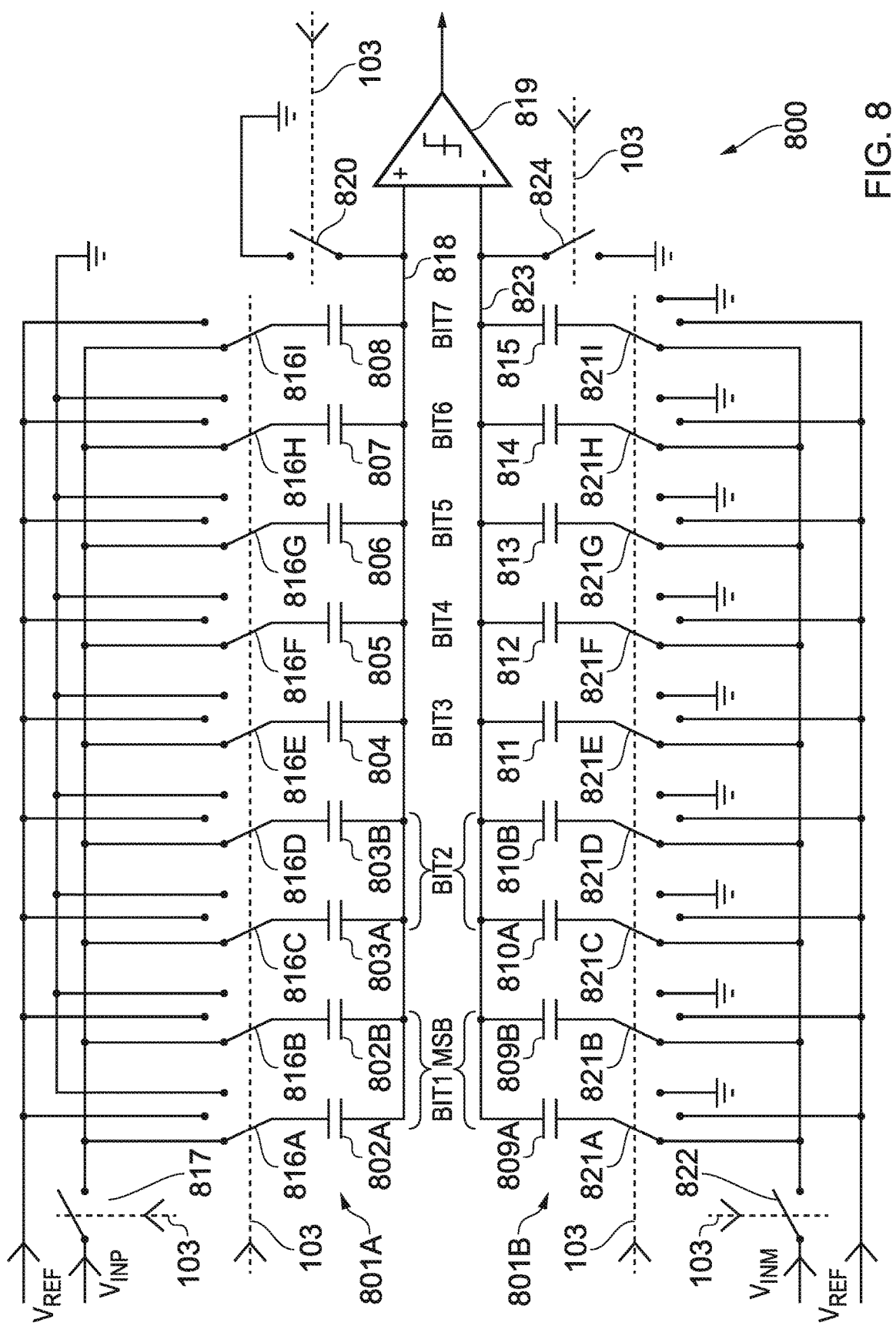
FIG. 8 is a schematic circuit diagram of a binary-weighted capacitive DAC in accordance with an alternative embodiment of the disclosure.

The above example is given in the context of a single-ended input. The disclosure may also be applied to differential SAR ADCs. An example of a differential DAC 800 used to implement the present disclosure is shown in FIG. 8. The arrangement of FIG. 8 is similar to that shown in FIG. 5, however there are two binary-weighted capacitor arrays; one for each input.

In the example shown in FIG. 8, the DAC is a 6-bit differential DAC. Each input is connected to a different array of capacitors. A first array 801A is connected to a first analog input $V_{INP}$. A second array 801B is connected to a second analog input $V_{INM}$. In this example, bit 1 of the first array is represented by a pair of split capacitors 802A and 802B each having a value equivalent to sixteen. Bit 2 of the first array is represents the binary equivalent of 16 and includes a pair of split capacitors 803A and 803B. Each of these capacitors has a value equivalent to eight. Bit 3 represents the digital equivalent of 8 and has a single capacitor 804. Bit 4 has a single capacitor 805 representing digital 4. Bit 5 has one capacitor 806 representing digital 2. Bit 6 is the least significant bit (LSB) having a single capacitor 807 representing digital 1. Bit 7 is a dummy bit which has a capacitor 808 is equivalent in value to 807.

The second array includes a set of capacitors which mirror the capacitors of the first array. In this example, bit 1 of the second array is represented by a pair of split capacitors 809A and 809B each having a value equivalent to sixteen. Bit 2 of the second array is represents the binary equivalent of 16 and includes a pair of split capacitors 810A and 810B. Each of these capacitors has a value equivalent to eight. Bit 3 represents the digital equivalent of 8 and has a single capacitor 811. Bit 4 has a single capacitor 812 representing digital 4. Bit 5 has one capacitor 813 representing digital 2. Bit 6 is the least significant bit (LSB) having a single capacitor 814 representing digital 1. Bit 7 is a dummy bit which has a capacitor 815 is equivalent in value to 814.

The capacitance of bit 1 is C, and as such the capacitance of each capacitor 802A, 802B, 809A and 809B is C/2. The capacitance of the remaining bits is as follows:
Bit 2=C/2
Bit 3=C/4
Bit 4=C/8
Bit 5=C/16
Bit 6=C/32
Bit 7=C/32

As such, the value of the remaining capacitors is as follows:
803A=C/4
803B=C/4
810A=C/4
810B=C/4
804=C/4
811=C/4
805=C/8
812=C/8
806=C/16
813=C/16
807=C/32
814=C/32
808=C/32
815=C/32

The total capacitance, $C_{TOTAL}$, for the array is 2C. The dummy bit (bit 7) is there to ensure the total is 2C.

The upper plates of each of the capacitors of the first array are connected to respective switches 816A to 816I. Each switch is a three-way switch which may be connected to the analog input signal $V_{INP}$, a reference voltage $V_{REF}$ and ground. The analog input signal $V_{INP}$ is connected to the switches via a further switch 817. The bottom plate of each of the capacitors is connected a common node 818, which is connected to the positive input of the comparator 819. The common node 819 is also connected to ground via switch 820.

The lower plates of each of the capacitors of the second array are connected to respective switches 821A to 821I. Each switch is a three-way switch which may be connected to the analog input signal $V_{INM}$, a reference voltage $V_{REF}$ and ground. The analog input signal $V_{INM}$ is connected to the switches via a further switch 822. The upper plate of each of the capacitors is connected a common node 823, which is connected to the negative input of the comparator 819. The common node 823 is also connected to ground via switch 824.

The switches are controlled by the control signal from the SAR logic, as with the DAC shown in FIG. 5. Other than the structural difference noted above, the DAC shown in FIG. 8 operates in the same manner as the operation of SAR ADC 100.

Figure 9:
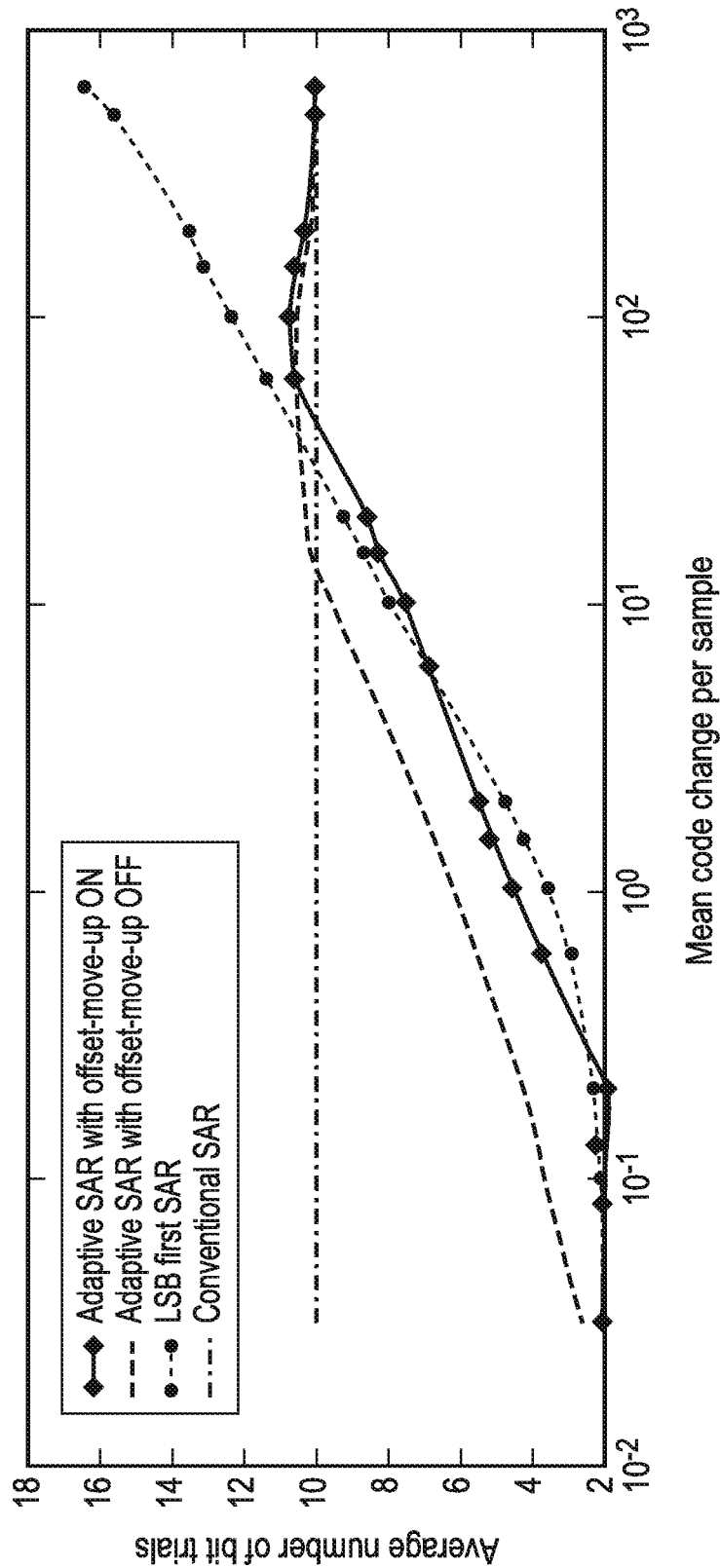
FIG. 9 is a chart showing average number of bit trials versus average code charge for a variety of SAR ADCs.

FIG. 9 is a chart showing the average number of bit trials versus the average code change for four different 10-bit SAR ADCs. Regardless of the code change per sample, a conventional SAR always carries out 10 bit trials, as would be expected. An LSB first SAR carries out more than 10 bit trials as the average code change increases. An adaptive SAR without the offset generally levels off at around 10 bit trials per sample, as the average code change increases. The SAR ADC of the present disclosure, using the offset, also levels off at around 10 bit trials per sample, bit performs better than an adaptive SAR without offset at lower average code changes.

It will be appreciated that this disclosure may be applied to DACs having arrangements other than those described above.

The invention claimed is:

1. A method of performing analog-to-digital conversion using a successive approximation register (SAR) analog-to-digital converter (ADC), comprising:
   performing bit trials, using a digital-to-analog converter (DAC) circuit of the SAR ADC, to convert a first sample of an analog input signal into an N-bit digital output;
   before performing bit trials on a second sample of the analog input signal, comparing the N-bit digital output with a first range, the first range based on the N-bit digital output;
   in response to determining that the N-bit digital output is outside the first range, preloading M bits of the N-bit digital output from the first sample plus an offset onto the DAC circuit; and
   performing bit trials on a second sample to determine the bits remaining.

2. The method according to claim 1, wherein the N-bit digital output defines a second range, and the N-bit digital output is within the second range, and the first range is a subrange of the second range.

3. The method according to claim 2, wherein the second range has a width the same as the Mth bit of the N-bit digital output.

4. The method according to claim 3, wherein a lower bound of the second range is the value of the most significant bit (MSB) to the Mth bit of the N-bit digital output, and an upper bound is the value of the lower bound plus the value of the Mth bit.

5. The A method according to claim 4, wherein the first range has a width the same as the Mth+1 bit of the of the N-bit digital output.

6. The method according to claim 1, wherein the offset is half of the Mth bit.

7. The method according to claim 6, wherein, if the N-bit digital output is greater than an upper bound of the first range, half a bit is added to the Mth bit, and if the N-bit digital output is lower than the lower bound, half a bit is subtracted from the Mth bit.

8. The method according to claim 7, wherein the DAC comprises at least one capacitor per bit, and for the MSB to Mth bits, the DAC comprises a pair of capacitors, each having half the value of a single capacitor.

9. The method according to claim 8, wherein a half bit is added by using one of a pair of capacitors for the Mth bit.

10. A successive approximation register (SAR) analog-to-digital converter (ADC) configured to perform bit trials to convert a first sample of an analog input signal into an N-bit digital output, the SAR ADC comprising:
    a digital-to-analog converter (DAC) circuit; and
    a control circuit configured to:
        compare the N-bit digital output with a first range, the first range based on the N-bit digital output, before performing bit trials on a second sample of the analog input signal;
        in response to determining that the N-bit digital output is outside the first range, instruct the DAC to preload M bits of the N-bit digital output from the first sample plus an offset onto the DAC circuit; and
        instruct the DAC to perform bit trials on a second sample to determine the bits remaining.

11. The SAR ADC according to claim 10, wherein the DAC comprises:
    an array of binary-weighted capacitors, wherein one or more of the binary-weighted capacitors corresponds to each bit of the DAC.

12. The SAR ADC according to claim 11, wherein one or more of the bits of the DAC have a corresponding pair of binary-weighted capacitors in the array, and each of the pair of capacitors is configured to produce an analog output equivalent to half a bit.

13. The SAR ADC according to claim 12, wherein each pair of binary-weighted capacitors in the array are further configured to generate an analog output equivalent to the corresponding bit of the DAC.

14. The SAR ADC according to claim 12, wherein the half-bit value is achieved by charging one of the capacitors, and the full-bit value is achieved by charging both capacitors.

15. The SAR ADC according to claim 10, wherein the offset is half the Mth bit.

16. The SAR ADC according to claim 10, wherein the Mth bit is counted from the most significant bit (MSB).

17. A method of preloading a digital-to-analog converter (DAC) arranged to perform bit trials in an analog-to-digital converter (ADC), comprising:
    determining a subrange defined by the first M bits of the previous N-bit digital output of the ADC, the subrange having a central portion and edge portions;
    determining the position of the previous digital output within the subrange; and
    in response that to determining that the previous digital output is within the edge portions, preloading the M bits plus an offset onto the DAC.

18. The method according to claim 17, wherein the offset is a half-bit.

19. The method according to claim 17, wherein the central portion is the middle two quarters of the range, and the edge portions and the outer two quarters of the subrange.

20. The method according to claim 17, wherein in response to determining that the previous digital output is in an upper edge portion, a positive offset is added to the preload, and in response to determining that the previous digital output is in a lower edge portion, a negative offset is added to the preload.

21. The method according to claim 1, further comprising:
    in response to determining that the N-bit digital output is within the first range, preloading M bits of the N-bit digital output from the first sample onto the DAC circuit.

22. The SAR ADC according to claim 10, wherein the control circuit is configured to:
    in response to determining that the N-bit digital output is within the first range, instruct the DAC to preload M bits of the N-bit digital output from the first sample onto the DAC circuit.

23. The method according to claim 17, further comprising:
    in response to determining that the previous digital output is within the central portion of the subrange, preloading the M bits onto the DAC.

* * * * *